US012713668B2

(12) United States Patent
Xie et al.

(10) Patent No.: US 12,713,668 B2
(45) Date of Patent: Aug. 18, 2026

(54) SINGLE DIFFUSION BREAK

(71) Applicant: INTERNATIONAL BUSINESS MACHINES CORPORATION, Armonk, NY (US)

(72) Inventors: Ruilong Xie, Niskayuna, NY (US); Chanro Park, Clifton Park, NY (US); Kangguo Cheng, Schenectady, NY (US); Julien Frougier, Albany, NY (US); Min Gyu Sung, Latham, NY (US)

(73) Assignee: International Business Machines Corporation, Armonk, NY (US)

( * ) Notice: Subject to any disclaimer, the term of this patent is extended or adjusted under 35 U.S.C. 154(b) by 511 days.

(21) Appl. No.: 17/811,315

(22) Filed: Jul. 8, 2022

(65) Prior Publication Data

US 2024/0014264 A1 Jan. 11, 2024

(51) Int. Cl.

| | |
|---|---|
| ***H01L 29/06*** | (2006.01) |
| ***H01L 21/8234*** | (2006.01) |
| ***H01L 29/08*** | (2006.01) |
| ***H01L 29/66*** | (2006.01) |
| ***H01L 29/775*** | (2006.01) |
| ***H01L 29/786*** | (2006.01) |
| ***H10D 30/01*** | (2025.01) |

(Continued)

(52) U.S. Cl.

CPC ......... *H10D 62/121* (2025.01); *H10D 30/014* (2025.01); *H10D 30/43* (2025.01); *H10D 30/6757* (2025.01); *H10D 62/151* (2025.01); *H10D 64/017* (2025.01); *H10D 64/021* (2025.01); *H10D 84/013* (2025.01); *H10D 84/0147* (2025.01); *H10D 84/038* (2025.01)

(58) Field of Classification Search

CPC .... H10D 30/014; H10D 30/024; H10D 30/43; H10D 30/62; H10D 30/6211; H10D 30/6212; H10D 30/6213; H10D 30/6219; H10D 30/6713; H10D 30/6735; H10D 30/6757; H10D 30/797; H10D 62/021; H10D 62/118; H10D 62/119; H10D 62/121; H10D 62/149; H10D 62/151; H10D 64/015; H10D 64/017; H10D 64/018; H10D 64/021; H10D 84/013; H10D 84/0147; H10D 84/0158; H10D 84/017; H10D 84/0193; H10D 84/038; H10D 84/834; H10D 84/853

See application file for complete search history.

(56) References Cited

U.S. PATENT DOCUMENTS 9,281,382 B2 3/2016 Liu
9,406,676 B2 * 8/2016 Yu ...................... H10D 84/0158

(Continued)

*Primary Examiner* — David C Spalla
(74) *Attorney, Agent, or Firm* — Yuanmin Cai

(57) ABSTRACT

Embodiments of present invention provide a semiconductor structure. The semiconductor structure includes a first transistor, a second transistor, and a third transistor separated by their respective source/drain regions; and a diffusion break between the second transistor and the third transistor, wherein a first distance between a center of a gate of the first transistor and a center of a gate of the second transistor is more than half of a second distance between the center of the gate of the second transistor and a center of a gate of the third transistor. A method of manufacturing the semiconductor structure is also provided.

14 Claims, 11 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 64/01*** | (2025.01) |
| ***H10D 84/01*** | (2025.01) |
| ***H10D 84/03*** | (2025.01) |

(56) References Cited

U.S. PATENT DOCUMENTS

| | | | | |
|---|---|---|---|---|
| 9,412,616 | B1 | 8/2016 | Xie | |
| 10,014,296 | B1 | 7/2018 | Dou | |
| 10,699,957 | B2 | 6/2020 | Zang | |
| 11,056,399 | B2 | 7/2021 | Yao | |
| 11,195,746 | B2 | 12/2021 | Ruilong | |
| 2016/0225762 | A1 | 8/2016 | Zang | |
| 2022/0376044 | A1* | 11/2022 | Yu | H10D 62/116 |
| 2023/0377943 | A1* | 11/2023 | Wu | H10W 10/014 |

* cited by examiner

SINGLE DIFFUSION BREAK

BACKGROUND

The present application relates to manufacturing of semiconductor integrated circuits. More particularly, it relates to method of manufacturing a diffusion break and the structure formed thereby.

As semiconductor industry moves towards smaller node, for example 7-nm node and beyond, field-effect-transistors (FETs) are aggressively scaled in order to fit into the reduced footprint or real estate, as defined by the node, with increased device density. Among various types of FETs, non-planar FETs such as fin-type FETs, vertical FETs, nanosheet FETs and/or nanowire FETs are just some examples that have demonstrated some potentials to at least partially meet this continued device scaling needs. In the meantime, logical transistors, and in particular different types of logic transistors such as p-type transistors and n-type transistors are typically separated from each other in order to achieve different functionality. The separation and/or isolation of transistors may be achieved through forming, for example, shallow-trench-isolation (STI) and/or diffusion break in the substrate. For example, there are single diffusion breaks, double diffusion breaks, etc., and one of the common approaches of manufacturing diffusion breaks is to fabricate a diffusion break in a location of a dummy gate of a dummy transistor, in a string or array of active transistors. However, using a dummy gate location in the fabrication of diffusion break may not represent an efficient use of the precious real estate in a semiconductor chip. This is because a dummy transistor, like an active transistor, normally occupies a space that is larger than what a diffusion break would need, resulting in waste of real estate.

SUMMARY

Embodiments of present invention provide a semiconductor structure. The semiconductor structure includes a first transistor, a second transistor, and a third transistor separated by their respective source/drain regions; and a diffusion break between the second transistor and the third transistor, wherein a first distance between a center of a gate of the first transistor and a center of a gate of the second transistor is more than half of a second distance between the center of the gate of the second transistor and a center of a gate of the third transistor.

In one embodiment, the diffusion break has a width and the gates of the first, second, and third transistors have a length, wherein the width of the diffusion break is smaller than the length of the gates.

In another embodiment, the first, second, and third transistors have their respective sidewall spacers, wherein two opposing sidewall spacers of the first transistor and the second transistor has a first gap and two opposing sidewall spacers of the second transistor and the third transistor has a second gap, wherein the second gap equals two times the first gap plus the width of the diffusion break.

In one embodiment, the diffusion break is adjacent to a source/drain (S/D) epi region of the second transistor and adjacent to a S/D epi region of the third transistor. In one aspect, the diffusion break extends into a substrate underneath the second and third transistors to separate the S/D epi region of the second transistor from the S/D epi region of the third transistor.

According to one embodiment, the semiconductor structure further includes a fourth transistor next to the third transistor, wherein a third distance between the center of the gate of the third transistor and a center of a gate of the fourth transistor equals to the first distance.

Embodiments of present invention also provide a method of forming a semiconductor structure. The method includes forming a first transistor, a second transistor, and a third transistor with an epitaxial source/drain region between the first and second transistors and between the second and third transistors; forming a conformal layer between the first and second transistors and between the second and third transistors, the conformal layer fully filling a gap between the first and second transistors and partially filling a gap between the second and third transistors; removing a portion of the conformal layer between the second and third transistors in an anisotropic etching process to expose a portion of the epitaxial source/drain region underneath thereof; removing the exposed portion of the epitaxial source/drain region and a portion of a substrate underneath thereof to create an opening; and forming a diffusion break within the opening.

In one embodiment, the first, second, and third transistors have their respective sidewall spacers, and forming the conformal layer includes depositing the conformal layer to have a thickness that equals to the gap between two opposing sidewalls of the first and second transistors.

In another embodiment, removing the portion of the conformal layer includes removing a horizontal portion of the conformal layer in the anisotropic etching process and leaving two vertical portions of the conformal layer next to two opposing sidewalls of the second and third transistors.

In one embodiment, forming the diffusion break includes filling the opening and a gap between the two vertical portions of the conformal layer with a dielectric material.

According to one embodiment, the method further includes removing the two vertical portions of the conformal layer that surrounds the diffusion break of the dielectric material and depositing an inter-level-dielectric (ILD) layer on top of and surrounding the diffusion break.

According to another embodiment, the method further includes forming gates of the first, second, and third transistors in a replacement-metal-gate process.

BRIEF DESCRIPTION OF THE DRAWINGS

The present invention will be understood and appreciated more fully from the following detailed description of embodiments of present invention, taken in conjunction with accompanying drawings of which.

Figure 1:
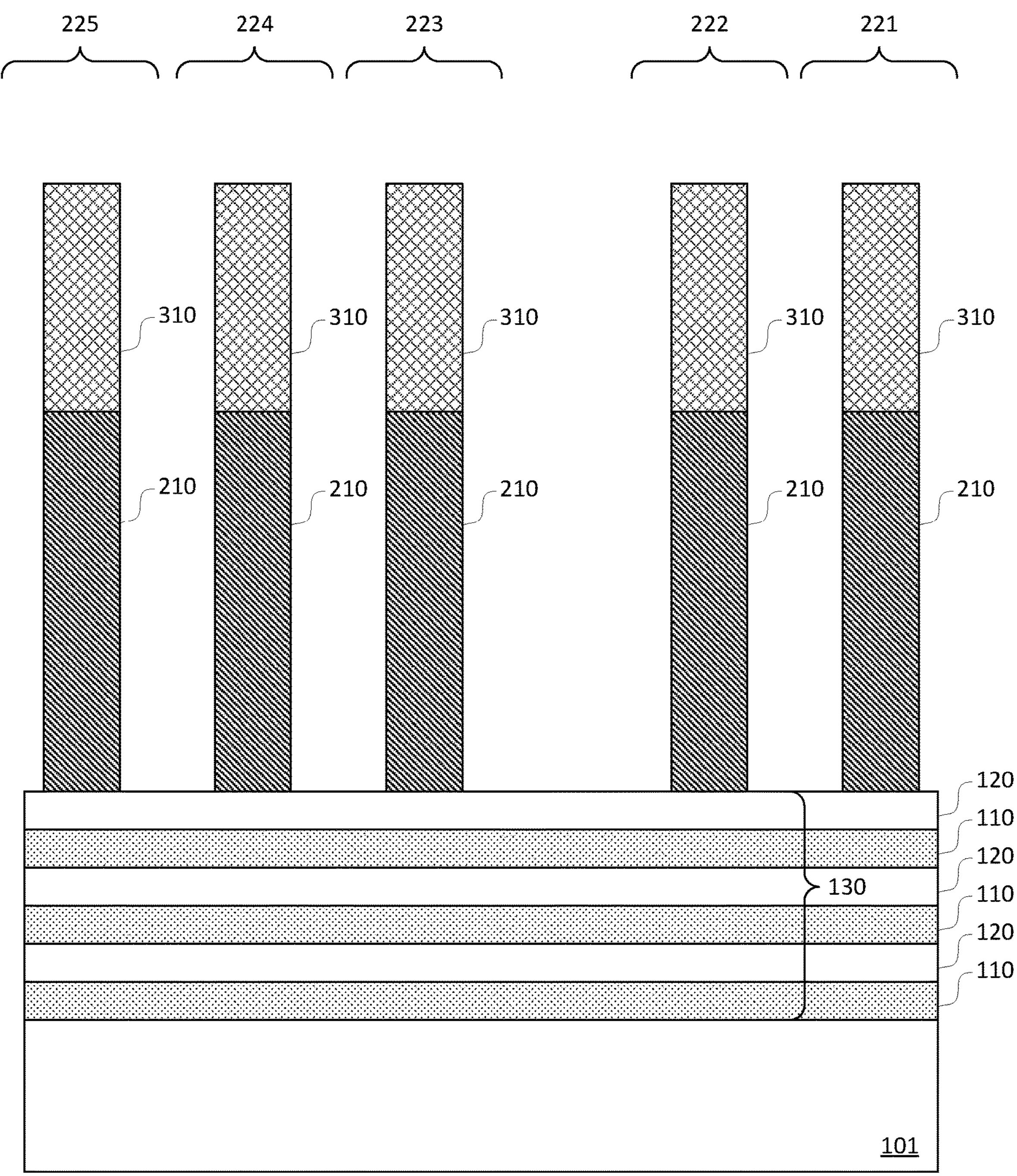
FIGS. 1-10 are demonstrative illustrations of cross-sectional views of a semiconductor structure in a process of manufacturing thereof according to various embodiments of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIG. 1 is a demonstrative illustration of cross-sectional view of a semiconductor structure in a step of manufacturing thereof according to one embodiment of present invention. More specifically, embodiments of present invention provide forming multiple transistors such as, for example, two or more nanosheet transistors on a substrate 101. Hereinafter, and being illustrated in FIG. 1, nanosheet transistors are used merely as an example for the description of embodiments of present invention. However, embodiments of present invention may be applied to other types of transistors such as, for example, planar transistors, fin-type transistors, vertical transistors. The substrate 101 may be a bulk semiconductor substrate such as, for example, a silicon (Si) substrate, a germanium (Ge) substrate, a silicon-germanium (SiGe) substrate, or any other suitable semiconductor substrate.

Embodiments of present invention provide forming a nanosheet stack 130 on top of the substrate 101. The nanosheet stack 130 may include a set of nanosheets 120 and a set of sacrificial sheets 110. The sacrificial sheets 110 may be stacked together with the set of nanosheets 120 in an alternating fashion, one over another as being demonstratively illustrated in FIG. 1. In one embodiment, the set of nanosheets 120 may be epitaxially grown Si sheets with a thickness ranging from about 4 nm to about 12 nm, and the set of sacrificial sheets 110 may be epitaxially grown SiGe sheets with a preferred Ge concentration such as 20~50%, and a thickness ranging from about 4 nm to about 20 nm. Embodiments of present invention further provide forming a set of dummy gates 210 on top of the nanosheet stack 130. The dummy gates 210 may be formed through, for example, first depositing a layer of dummy gate material such as, for example, a thin layer of SiO2 followed by polysilicon on top of the nanosheet stack 130; forming a set of hard masks 310 through patterning in a lithographic patterning process on top of the layer of dummy gate material; and subsequently transferring the pattern of the set of hard masks 310 into the layer of dummy gate material, through an anisotropic etching process such as, for example, a reactive-ion-etching (RIE) process, to form the set of dummy gates 210.

The set of dummy gates 210 may correspond to a set of nanosheet transistors such as, for example, a first nanosheet transistor 221, a second nanosheet transistor 222, a third nanosheet transistor 223, a fourth nanosheet transistor 224, and a fifth nanosheet transistor 225 to be formed later as being described below in more details. In one embodiment, a first distance between a center of the dummy gate 210 of the first nanosheet transistor 221 and a center of the dummy gate 210 of the second nanosheet transistor 222 is more than half of a second distance between the center of the dummy gate 210 of the second nanosheet transistor 222 and a center of the dummy gate 210 of the third nanosheet transistor 223. For example, the first distance between the center of the dummy gate 210 of the first nanosheet transistor 221 and the center of the dummy gate 210 of the second nanosheet transistor 222 may be 48 nm, and the second distance between the center of the dummy gate 210 of the second nanosheet transistor 222 and the center of the dummy gate 210 of the third nanosheet transistor 223 may be 78 nm.

Figure 2:
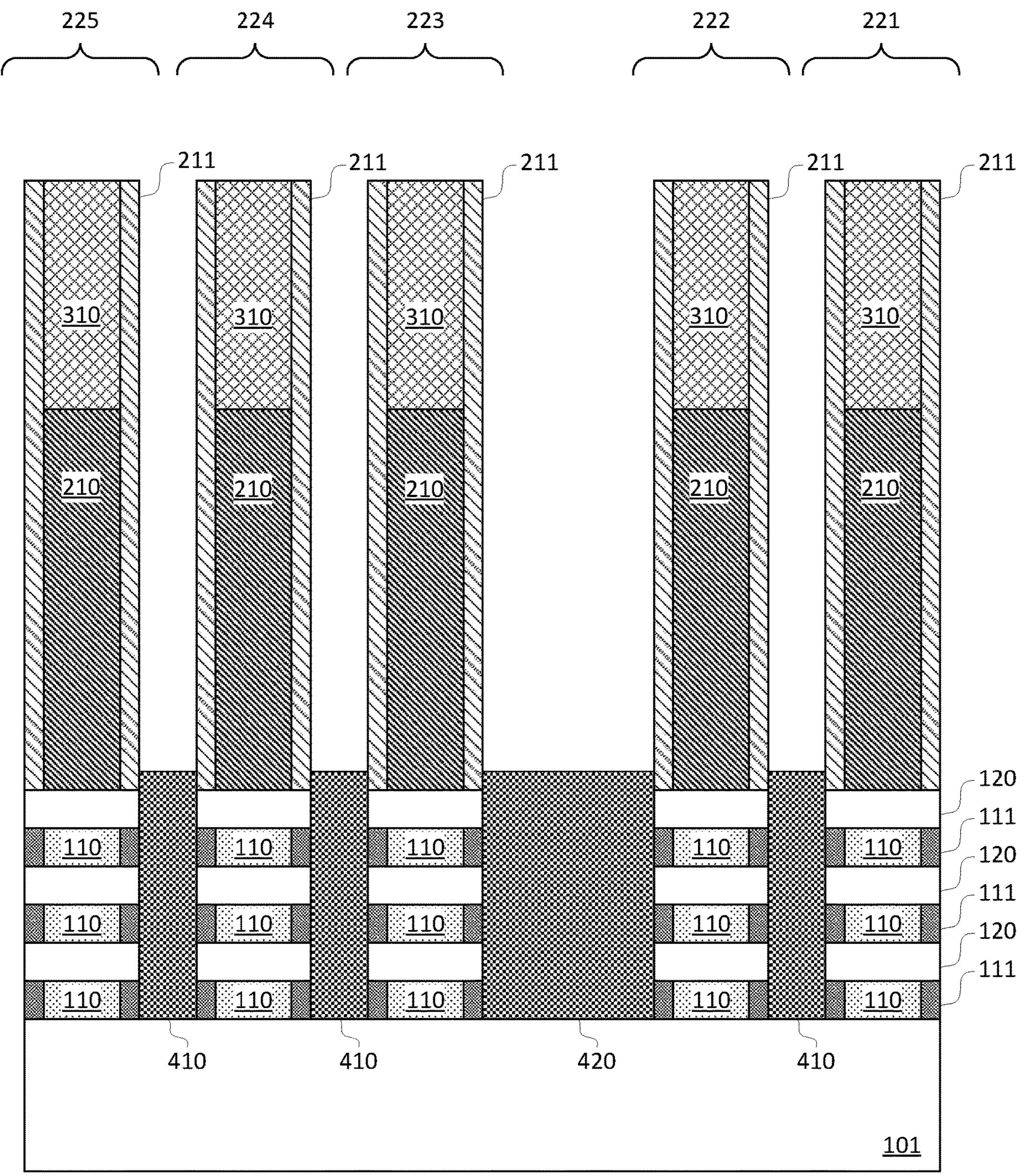

FIG. 2 is a demonstrative illustration of cross-sectional view of a semiconductor structure in a step of manufacturing thereof, following the step illustrated in FIG. 1, according to one embodiment of present invention. More specifically, embodiments of present invention provide forming sidewall spacers 211 at the sidewalls of the set of dummy gates 210 and subsequently using the sidewall spacers 211 and the set of hard masks 310 as an etch mask in a patterning process to etch the nanosheet stack 130 thereby cutting the set of sacrificial sheets 110 and the set of nanosheets 120. The patterning process creates multiple nanosheet stacks that correspond to the individual nanosheet transistors 221, 222, 223, 224, and 225. Embodiments of present invention further provide forming indentation at the ends of the sacrificial sheets 110 of each nanosheet stack; forming inner spacers 111 at spaces created by the indentation at the ends of the sacrificial sheets 110; and forming epitaxial source/drain regions 410 and 420 at the ends of the nanosheets 120 of each nanosheet stack.

Figure 3:
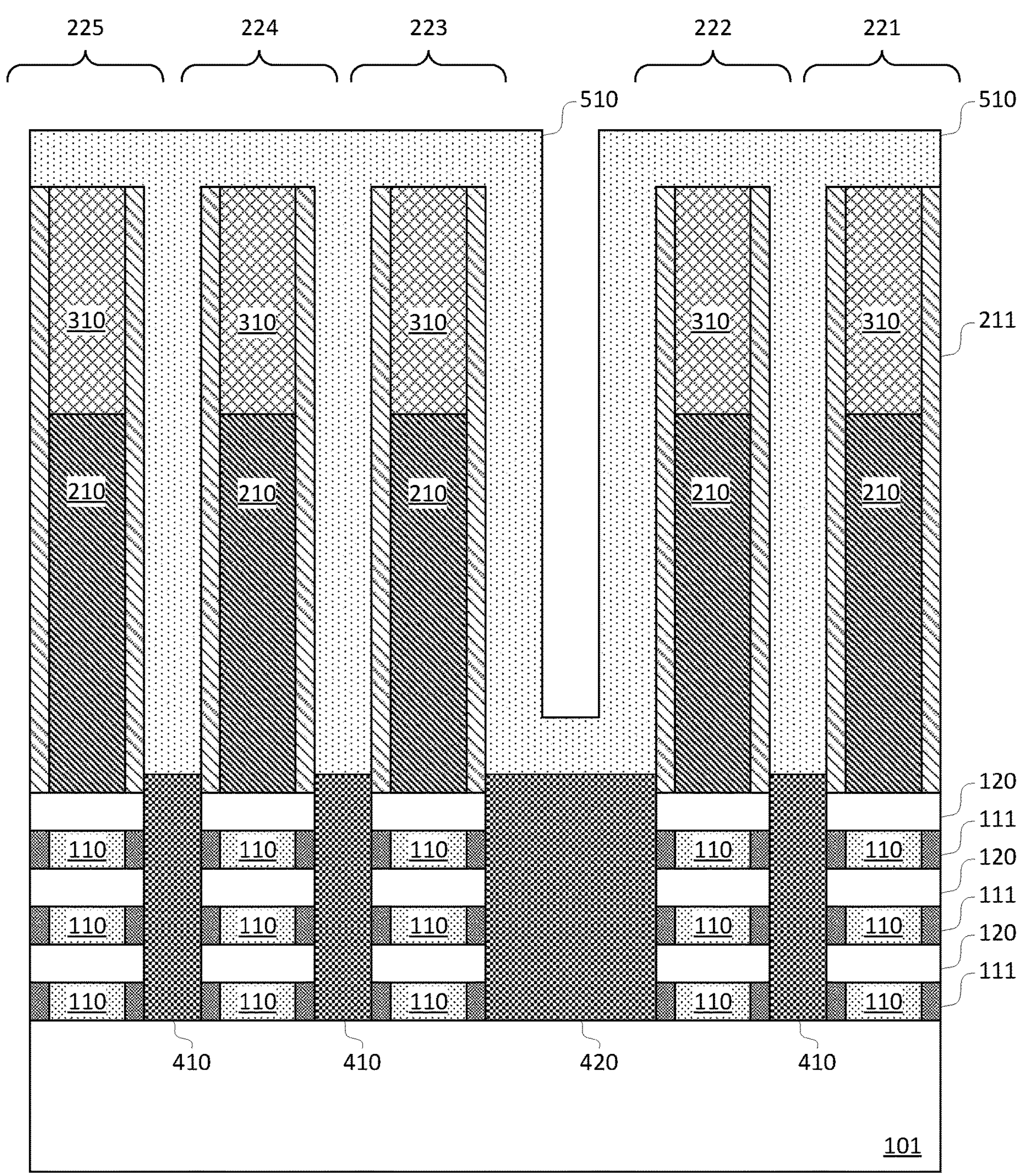

FIG. 3 is a demonstrative illustration of cross-sectional view of a semiconductor structure in a step of manufacturing thereof, following the step illustrated in FIG. 2, according to one embodiment of present invention. More specifically, embodiments of present invention provide forming a conformal layer 510 lining the gaps between opposing sidewall spacers 211 of the transistors. The conformal layer 510 may be titanium oxide, aluminum oxide, or other suitable materials.

In one embodiment, the conformal layer 510 may be formed or deposited, for example through an atomic-layer-deposition (ALD) process, to have a thickness that equals to the gap between two opposing sidewall spacers 211 of two neighboring nanosheet transistors such as between the first and second nanosheet transistors 221 and 222, between the third and fourth nanosheet transistors 223 and 224, and between the fourth and fifth nanosheet transistors 224 and 225. In one embodiment, the thickness of the conformal layer 510 may be less than half of a gap between the two opposing sidewall spacers 211 of the second and third nanosheet transistors 222 and 223. In other words, the conformal layer 510 fully fills the gaps between the first and second nanosheet transistors 221 and 222, between the third and fourth nanosheet transistors 223 and 224, and between the fourth and fifth nanosheet transistors 224 and 225. On the other hand, the conformal layer 510 may only partially fill the gap between the second and third nanosheet transistors 222 and 223, leaving a gap corresponding to a region that may be used for forming a diffusion break between the second and third nanosheet transistors 222 and 223, as being described below in more details.

Figure 4:
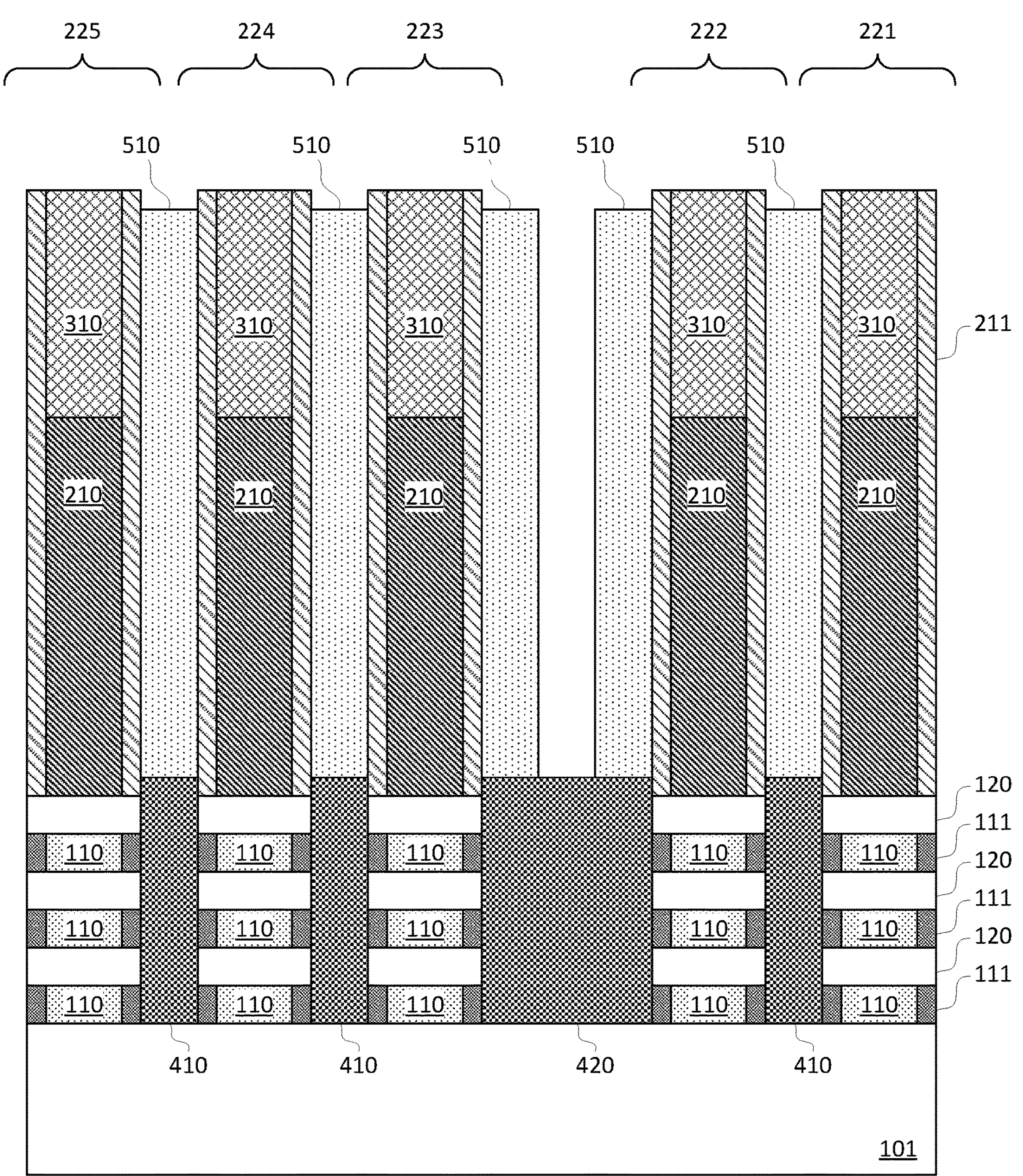

FIG. 4 is a demonstrative illustration of cross-sectional view of a semiconductor structure in a step of manufacturing thereof, following the step illustrated in FIG. 3, according to one embodiment of present invention. More specifically, embodiments of present invention provide removing a portion of the conformal layer 510 between the second and third nanosheet transistors 222 and 223 in an anisotropic etching process. More particularly, the anisotropic etching process removes a horizontal portion of the conformal layer 510 thereby exposing a portion of the epitaxial source/drain region 420 underneath thereof between nanosheet transistors 222 and 223. The anisotropic etching process may also remove portions of the conformal layer 510 above the hard masks 310. Since the gaps between the first and second nanosheet transistors 221 and 222, between the third and fourth nanosheet transistors 223 and 224, and between the fourth and fifth nanosheet transistors 224 and 225 are fully filled with the conformal layer 510, source/drain regions 410 therein between may not be affected by the anisotropic etching process.

Figure 5:
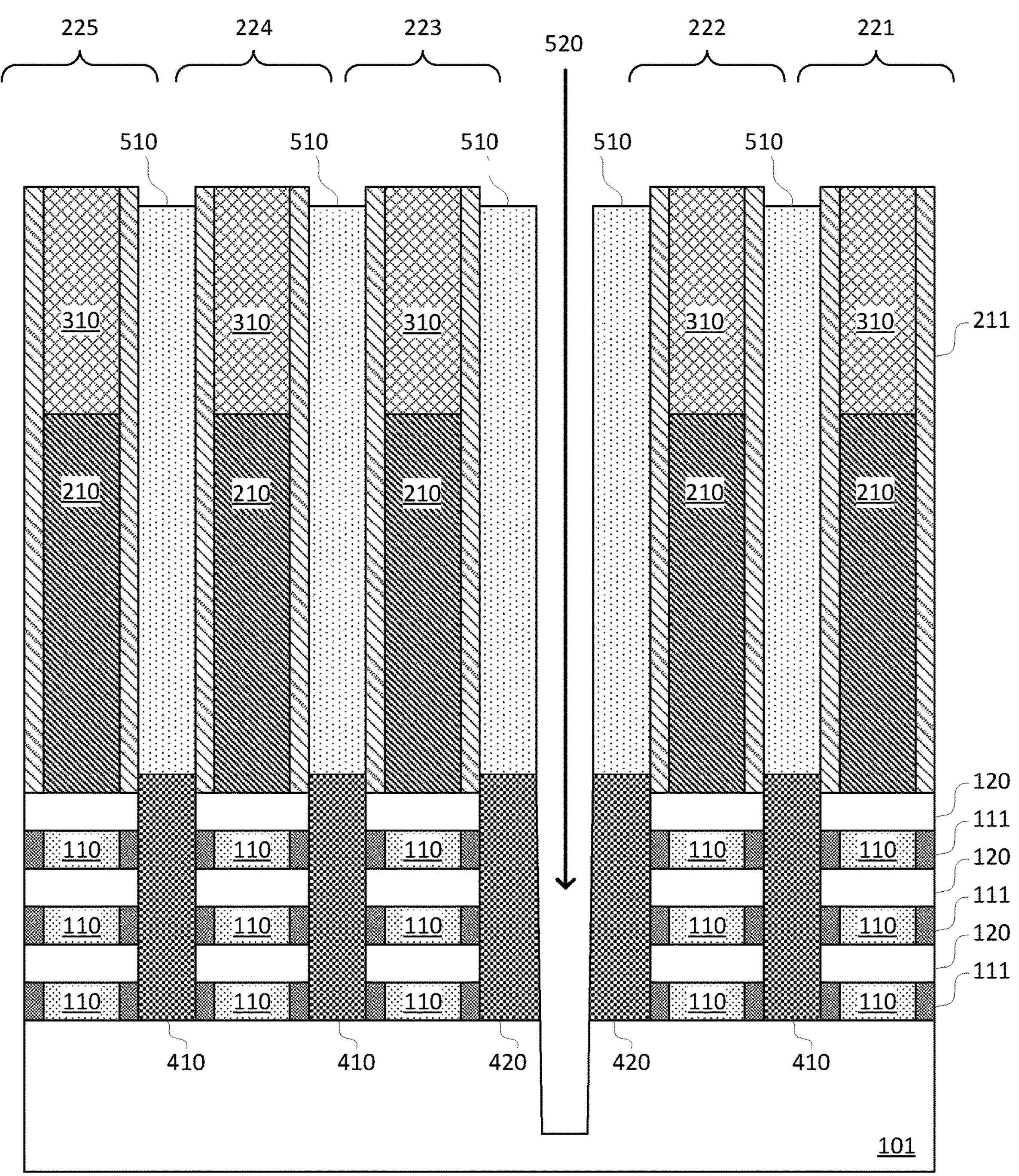

FIG. 5 is a demonstrative illustration of cross-sectional view of a semiconductor structure in a step of manufacturing thereof, following the step illustrated in FIG. 4, according to one embodiment of present invention. More specifically, embodiments of present invention provide removing the exposed portion of the epitaxial source/drain region 420 and a portion of the substrate 101 underneath thereof through an anisotropic etching process such as a reactive-ion-etching (RIE) etching process. The etching process creates an opening 520 between the second nanosheet transistor 222 and the third nanosheet transistor 223 wherein a diffusion break may be made.

Figure 6:
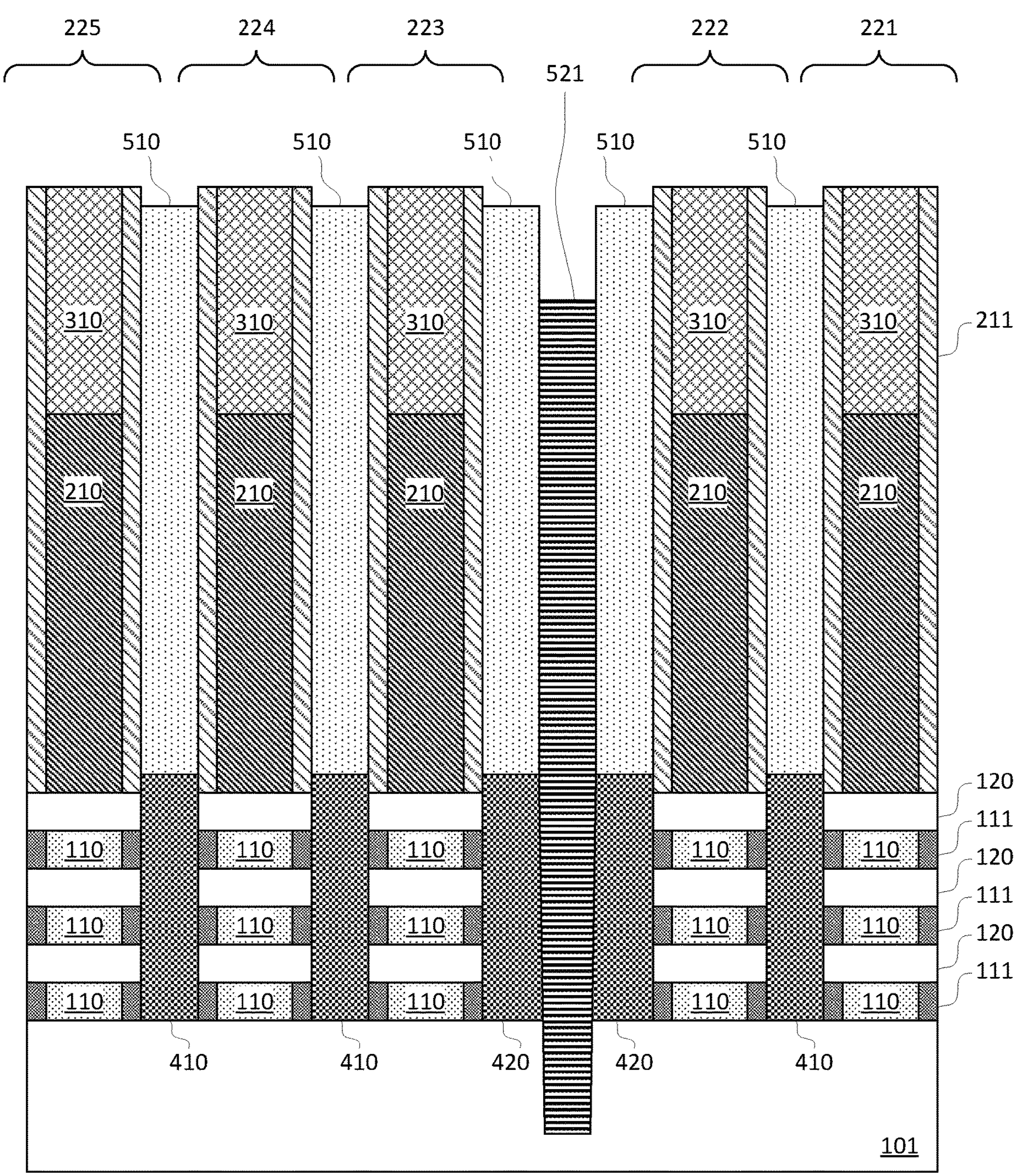

FIG. 6 is a demonstrative illustration of cross-sectional view of a semiconductor structure in a step of manufacturing thereof, following the step illustrated in FIG. 5, according to one embodiment of present invention. More specifically, embodiments of present invention provide filling the opening 520 with a dielectric material to form a diffusion break 521. For example, a deposition process may first be used to fill the opening 520 with a dielectric material such as, for example, silicon-nitride (SiN), silicon-oxide (SiOx), silicon-carbide (SiC), silicon-oxycarbide (SiOC), silicon-boroncarbonitride (SiBCN), silicon-oxycarbonitride (SiOCN) or other suitable insulating materials. The deposition process may then be followed by a recessing process to remove any excessive portion of the dielectric material above a level of the hard masks 310. The diffusion break 521 formed thereby may be above the level of the epitaxial source/drain region 420 and between the remaining vertical portions of the conformal layer 510.

Figure 7:
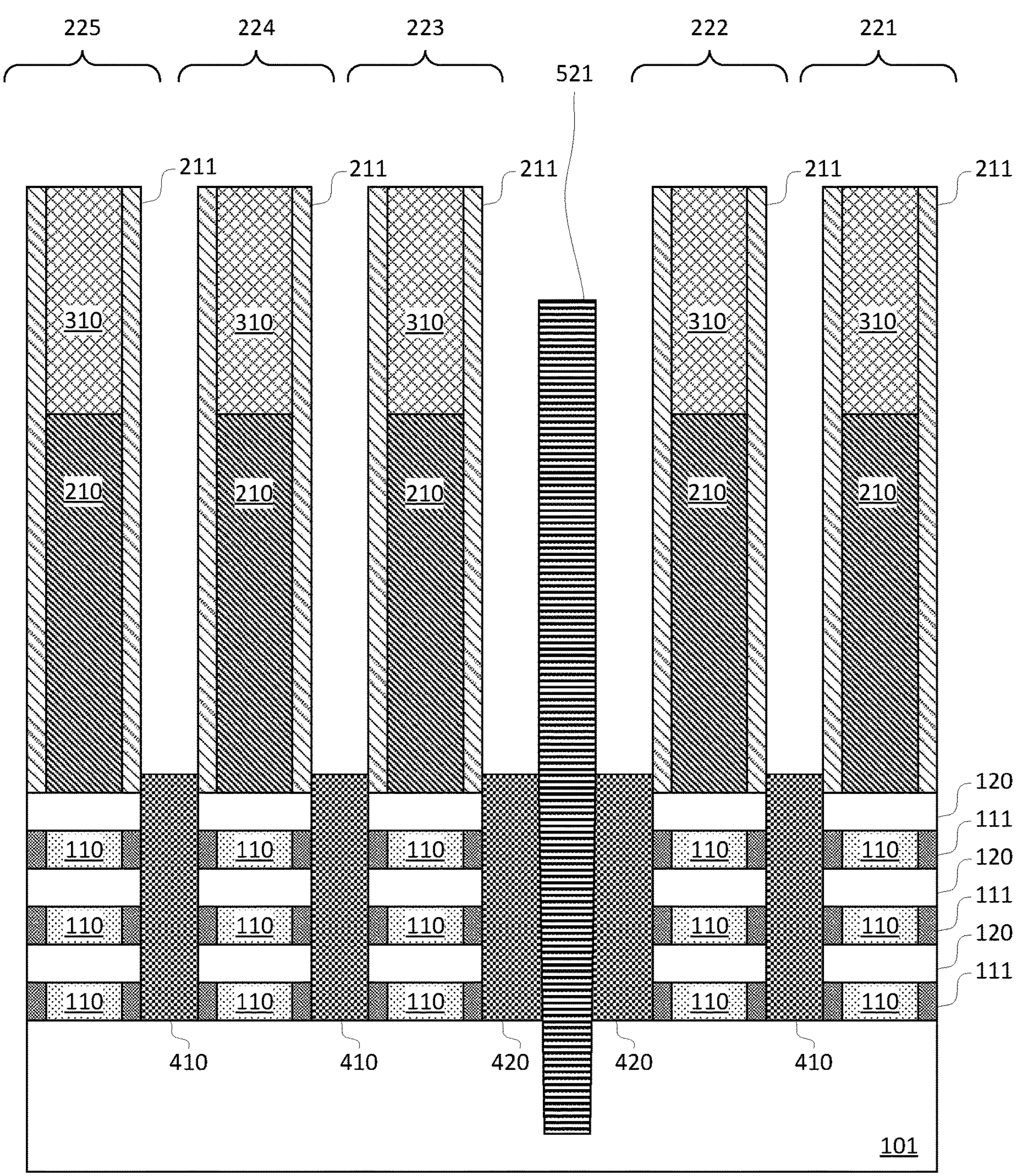

FIG. 7 is a demonstrative illustration of cross-sectional view of a semiconductor structure in a step of manufacturing thereof, following the step illustrated in FIG. 6, according to one embodiment of present invention. More specifically, embodiments of present invention provide selectively removing the conformal layer 510 that is next to the sidewalls of the nanosheet transistors 221-225 above the epitaxial source/drain region 410 and that surrounds the diffusion break 521 above the epitaxial source/drain region 420. The removal of the conformal layer 510 exposes the sidewall spacers 211 and top surfaces of the epitaxial source/drain regions 410 and 420 and a portion of the diffusion break 521 above the epitaxial source/drain region 420.

Figure 8:
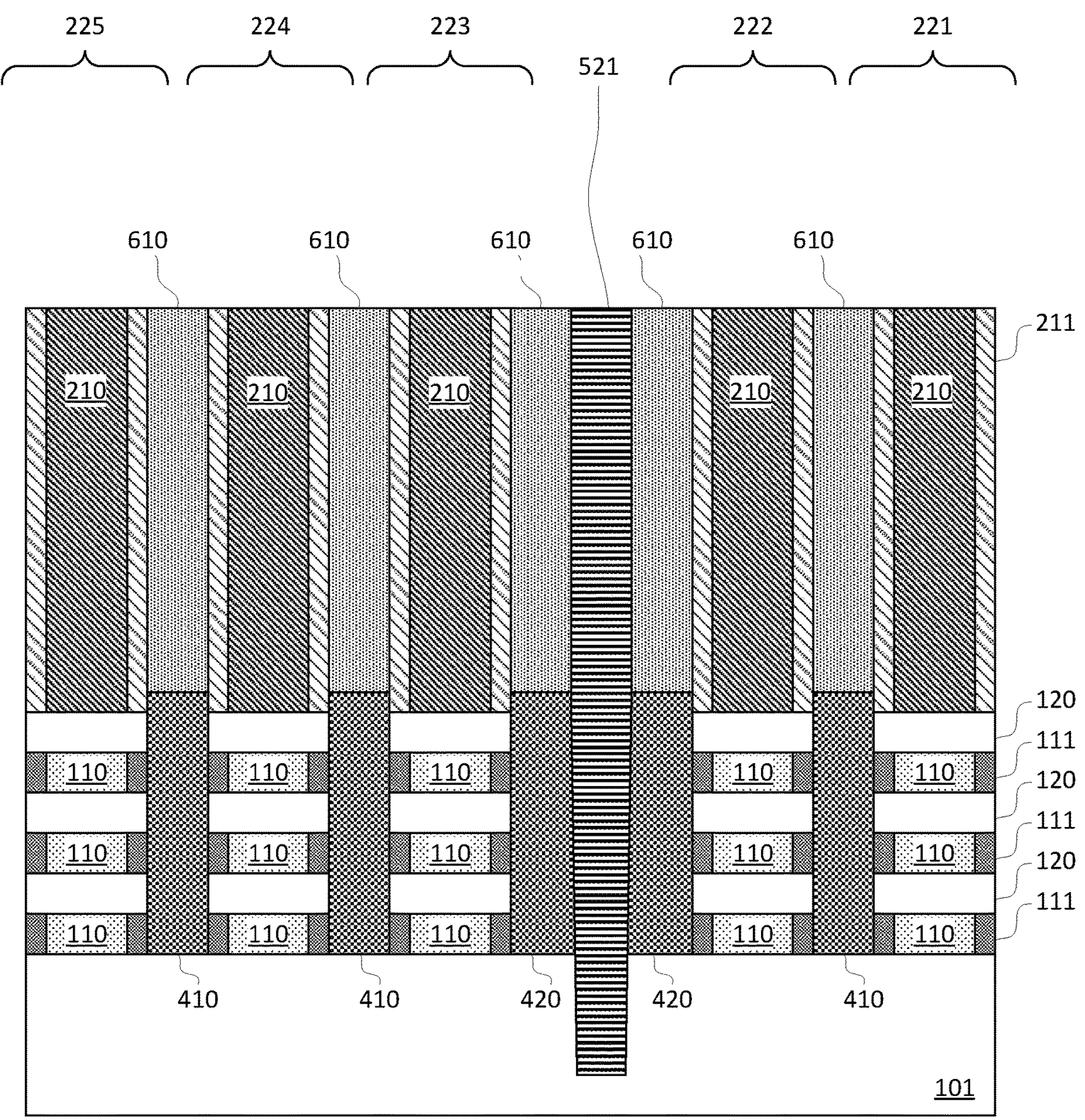

FIG. 8 is a demonstrative illustration of cross-sectional view of a semiconductor structure in a step of manufacturing thereof, following the step illustrated in FIG. 7, according to one embodiment of present invention. More specifically, embodiments of present invention provide covering the exposed epitaxial source/drain regions 410 and 420 with an interlevel-dielectric (ILD) layer 610. The ILD layer 610 may be $SiO_2$, or a low-k dielectric material and maybe formed through, for example, a chemical-vapor-deposition (CVD) process. Embodiments of present invention further provide applying, for example, a chemical-mechanic-polishing (CMP) process to remove any excessive low-k dielectric material of the ILD layer 610 and subsequently the hard masks 310 thereby exposing a top surface of the underneath dummy gates 210. The CMP process creates a top surface of the ILD layer 610 that is co-planar with the top surface of the dummy gate 210.

Figure 9:
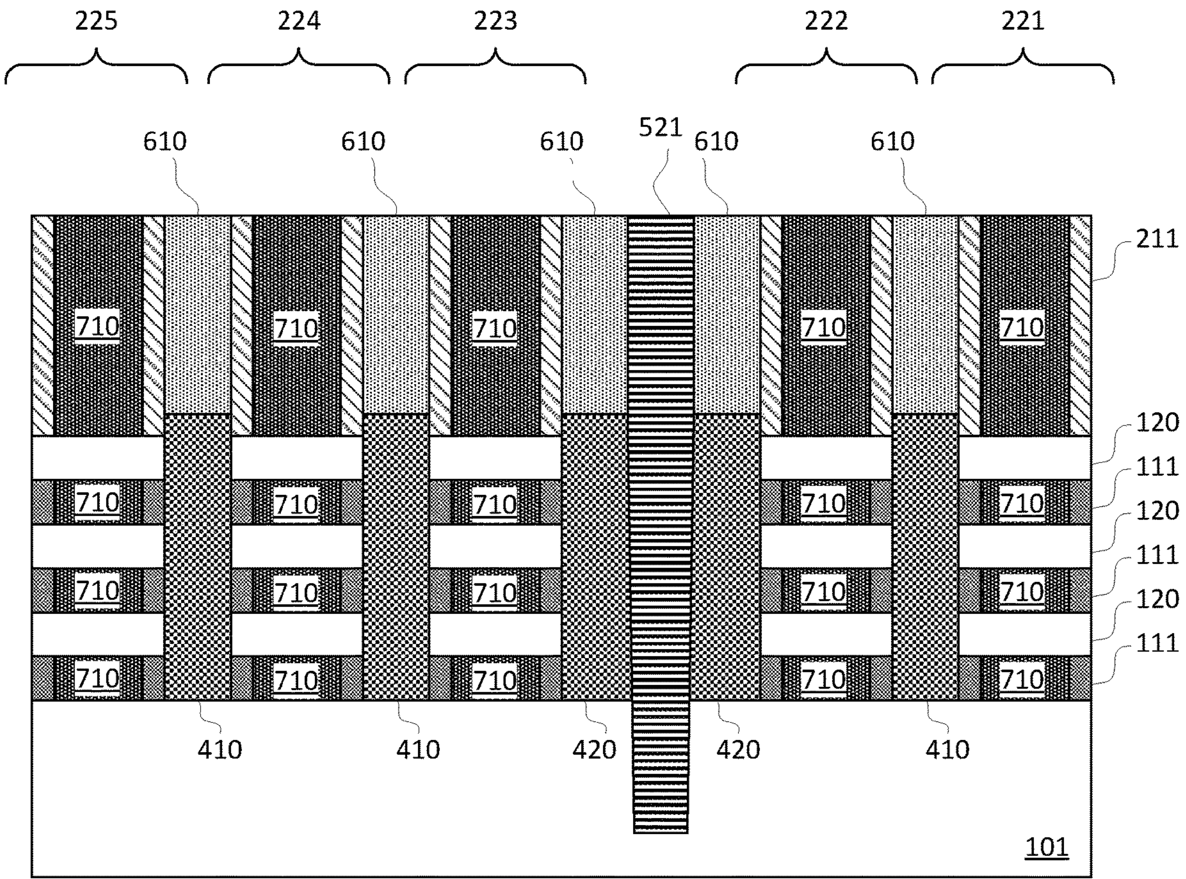

FIG. 9 is a demonstrative illustration of cross-sectional view of a semiconductor structure in a step of manufacturing thereof, following the step illustrated in FIG. 8, according to one embodiment of present invention. More specifically, embodiments of present invention provide performing a replacement-metal-gate process to form gates 710. For example, the dummy gates 210 may first be selectively removed. After removing the dummy gates 210, the remaining sacrificial sheets 110, in each of the nanosheet stacks of the nanosheet transistors 221-225, between inner spacers 111 may be selectively removed to expose the set of nanosheets 120. Subsequently, a high-k gate dielectric layer may be deposited through, for example an atomic-layer-deposition (ALD) process, to cover the nanosheets 120. The high-k gate dielectric layer maybe a layer of hafnium-oxide (HfO), zirconium-oxide (ZrOx), hafnium-silicon-oxide (HfSiOx), hafnium-aluminum-oxide (HfAlOx), hafnium-lanthanum-oxide (HfLaOx), or other suitable dielectric material with a k value higher than, for example, 4. Next, one or more work-function metal (WFM) layers, such as titanium-nitride (TiN), titanium-carbide (TiC), titanium-aluminum (TiAl), titanium-aluminum-carbide (TiAlC), etc. may be deposited on top of the high-k gate dielectric layer and other conductive material such as tungsten (W) or aluminum (Al) may subsequently be deposited on top of WFM layers to form the gate 710.

As being demonstratively illustrated in FIG. 9, the first, second, third, fourth, and fifth nanosheet transistors are separated by their respective epitaxial source/drain regions 410 and 420, and the second nanosheet transistor 222 and the third nanosheet transistor 223 are further separated by the diffusion break 521 therein-between. The diffusion break 521 has a width that is smaller than a length (from source to drain) of the metal gate 710. As is clear from the above description, a first distance between a center of the metal gate 710 of the first nanosheet transistor 221 and a center of the metal gate 710 of the second nanosheet transistor 222 is more than half of a second distance between the center of the metal gate 710 of the second nanosheet transistor 222 and a center of the metal gate 710 of the third nanosheet transistor 223. In other words, the first, second, third, fourth, and fifth nanosheet transistors are not equally spaced.

In one embodiment, the diffusion break 521 may have a horizontal width that may be made less than a length of the metal gates of the nanosheet transistors. This is because, unlike in a conventional approach of making single diffusion break where the location of a dummy gate is used for forming a single diffusion break, the horizontal width of the diffusion break 521 may be designed herein, in one embodiment, to have a width less than a length of the gate between two source/drain regions of a nanosheet transistor. For example, the nanosheet transistors 221-225 may have a gate length of about 18 nm with sidewall spacers of a width of about 6 nm. In the meantime, the diffusion break 521 may have a width of about 10 nm or less.

In this instance, embodiments of present invention provide a diffusion break that has a footprint of about 10 nm, as compared with a conventional diffusion break which would otherwise has a footprint of about 30 nm.

In another embodiment, the first, second, third, fourth, and fifth nanosheet transistors 221-225 have their respective sidewall spacers 211, and two opposing sidewall spacers 211 of the first nanosheet transistor 221 and the second nanosheet transistor 222 has a first gap that equals to a thickness of the conformal layer 510. The two opposing sidewall spacers 211 of the second nanosheet transistor 222 and the third nanosheet transistor 223 has a second gap. From the above description it is clear that the second gap equals two times the first gap, i.e., the thickness of the conformal layer 510, plus the width of the diffusion break 521.

In yet another embodiment, it is clear that the diffusion break 521 is adjacent to the epitaxial source/drain regions 420 of the second nanosheet transistor 222 and the third nanosheet transistor 223. The diffusion break 521 extends further into the substrate 101 underneath the second and third nanosheet transistors 222 and 223 to separate the epitaxial source/drain regions of the second and third nanosheet transistors.

Figure 10:
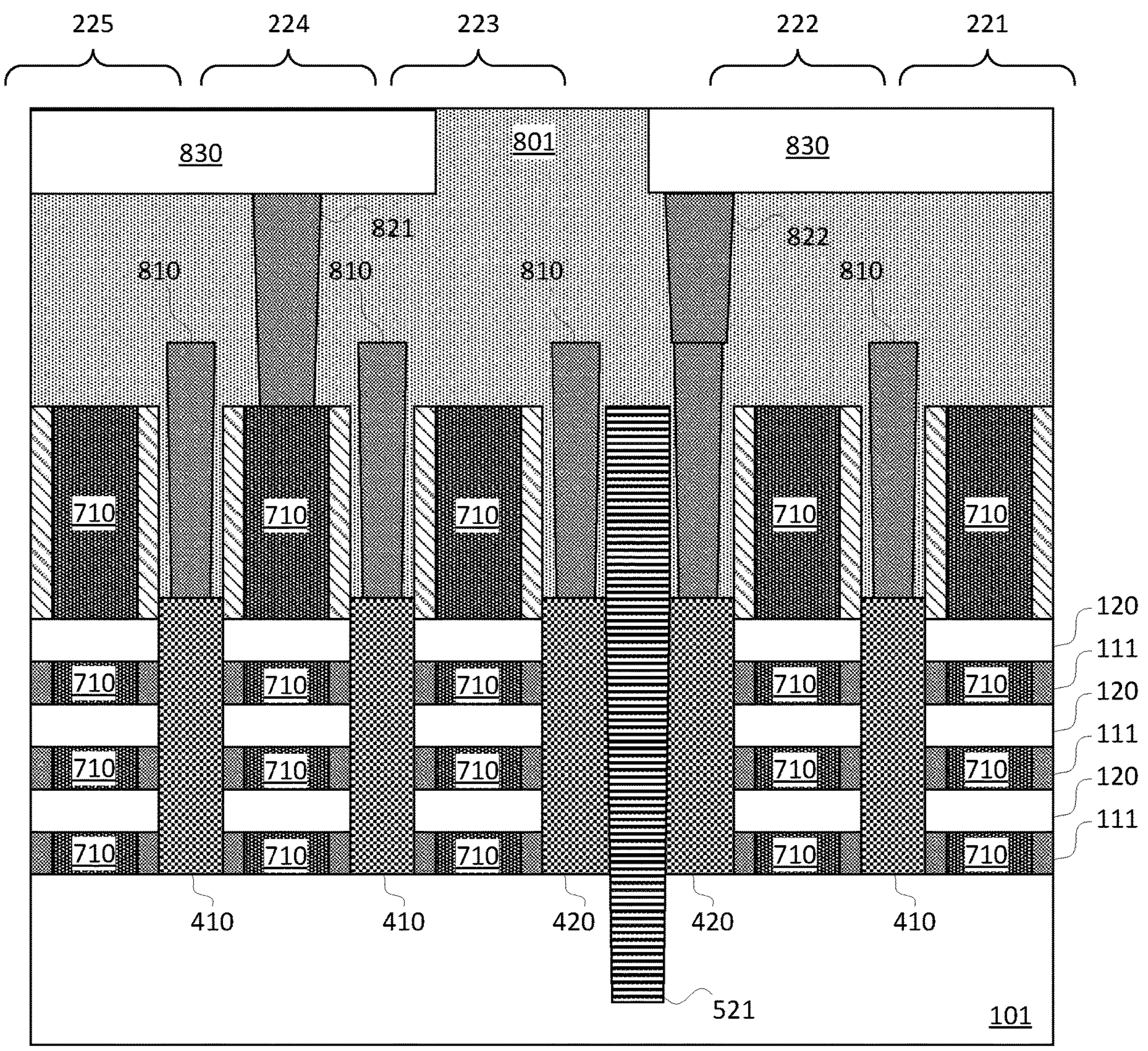

FIG. 10 is a demonstrative illustration of cross-sectional view of a semiconductor structure in a step of manufacturing thereof, following the step illustrated in FIG. 9, according to one embodiment of present invention. More specifically, embodiments of present invention provide forming contacts and local interconnects to the nanosheet transistors. For example, embodiments of present invention may include forming contacts 810, knows as CA contacts, to the epitaxial source/drain regions 410 and 420; forming via contacts such as via contact 821 to the metal gate 710 and via contact 822 to the source/drain contact 810; and forming metal level 830 in contact with the via contacts such as via contacts 821 and 822. The via contacts 821 and 822 and metal level 830, which may be for example an M1 or M2 metal level, may be formed embedded in a dielectric layer 801.

Figure 11:
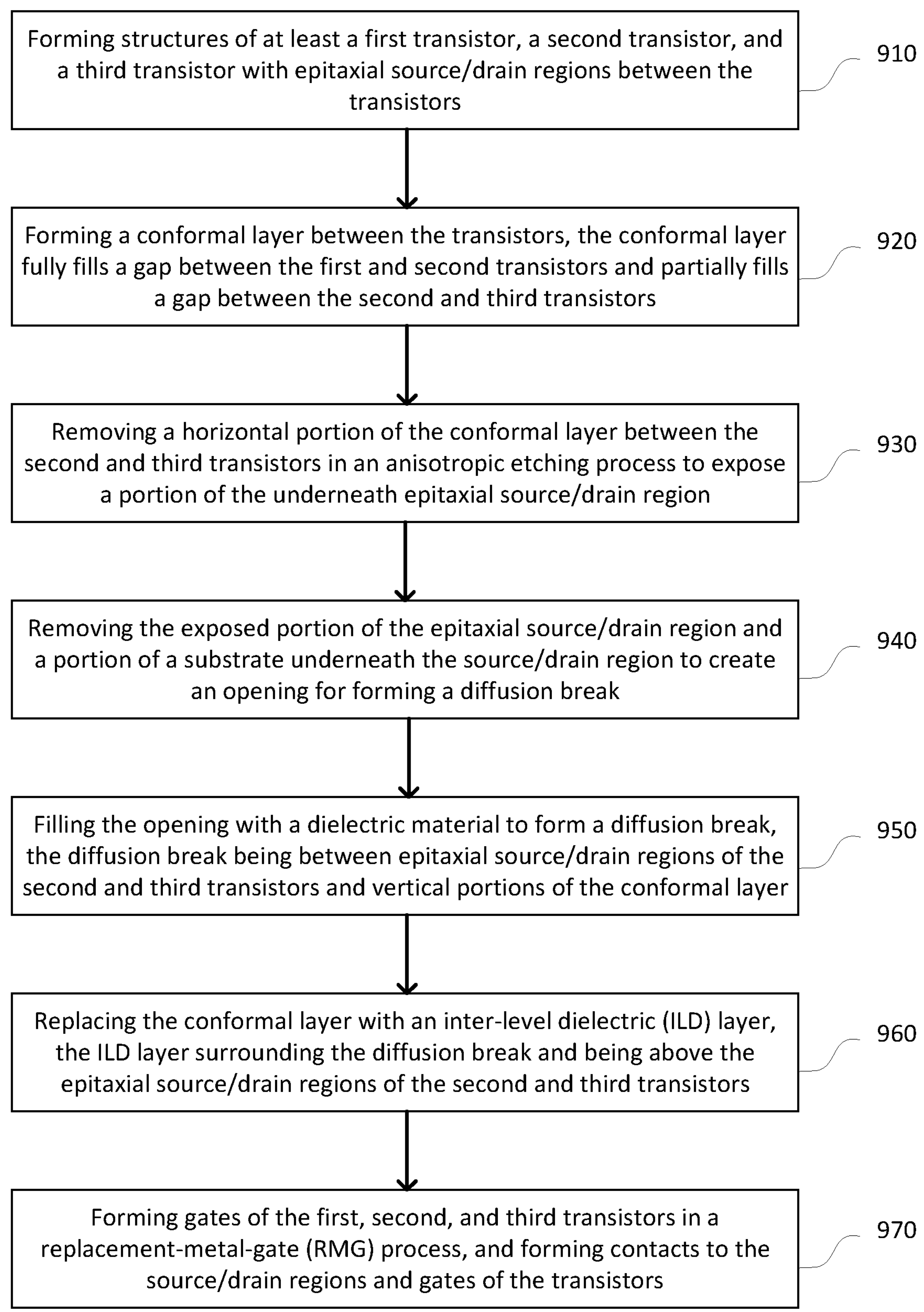
FIG. 11 is a demonstrative illustration of a flow-chart of a method of manufacturing a semiconductor structure according to embodiments of present invention.

FIG. 11 is a demonstrative illustration of a flow-chart of a method of manufacturing a diffusion break according to embodiments of present invention. The method includes (910) forming structures of at least a first transistor, a second transistor, and a third transistor with epitaxial source/drain regions between the transistors; (920) forming a conformal layer between the transistors, the conformal layer fully fills a gap between the first and second transistors and partially fills a gap between the second and third transistors; (930) removing a horizontal portion of the conformal layer between the second and third transistors in an anisotropic etching process to expose a portion of the underneath epitaxial source/drain region; (940) removing the exposed portion of the epitaxial source/drain region and a portion of a substrate underneath the source/drain region to create an opening for forming a diffusion break; (950) filling the opening with a dielectric material to form a diffusion break, the diffusion break being between epitaxial source/drain regions of the second and third transistors and vertical portions of the conformal layer; (960) replacing the conformal layer with an inter-level dielectric (ILD) layer, the ILD layer surrounding the diffusion break and being above the epitaxial source/drain regions of the second and third transistors; and (970) forming gates of the first, second, and third transistors in a replacement-metal-gate (RMG) process, and forming contacts to the source/drain regions and gates of the transistors.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A semiconductor structure comprising:

a first transistor, a second transistor, and a third transistor separated by their respective source/drain regions; and a diffusion break between the second transistor and the third transistor, wherein the second transistor has a first source/drain region shared with the first transistor, and has a second source/drain region at a first side of the diffusion break and in direct contact with the diffusion break; and wherein the third transistor has a first source/drain region at a second side of the diffusion break and in direct contact with the diffusion break, the second side being opposite the first side;

wherein a first distance between a center of a gate of the first transistor and a center of a gate of the second transistor is more than half of a second distance between the center of the gate of the second transistor and a center of a gate of the third transistor.

2. The semiconductor structure of claim 1, wherein the diffusion break has a width and the gates of the first, second, and third transistors have a length, wherein the width of the diffusion break is smaller than the length of the gates.

3. The semiconductor structure of claim 2, wherein the first, second, and third transistors have their respective sidewall spacers, wherein two opposing sidewall spacers of the first transistor and the second transistor has a first gap and two opposing sidewall spacers of the second transistor and the third transistor has a second gap, and wherein the second gap equals two times the first gap plus the width of the diffusion break.

4. The semiconductor structure of claim 1, wherein the diffusion break is adjacent to a source/drain (S/D) epi region of the second transistor and adjacent to a S/D epi region of the third transistor.

5. The semiconductor structure of claim 4, wherein the diffusion break extends into a substrate underneath the second and third transistors to separate the S/D epi region of the second transistor from the S/D epi region of the third transistor.

6. The semiconductor structure of claim 1, further comprising a fourth transistor next to the third transistor, wherein a third distance between the center of the gate of the third transistor and a center of a gate of the fourth transistor equals to the first distance.

7. A semiconductor structure comprising:

a first transistor, a second transistor, a third transistor, and a fourth transistor separated by their respective source/drain regions, a first distance between the first and second transistors is more than half of a second distance between the second and third transistors; and a diffusion break between the second transistor and the third transistor, wherein the second transistor has a first source/drain region shared with the first transistor, and has a second source/drain region at a first side of the diffusion break and in direct contact with the diffusion break; the third transistor has a first source/drain region at a second side of the diffusion break and in direct contact with the diffusion break, and has a second source/drain region shared with the fourth transistor, the first side being opposite the second side.

8. The semiconductor structure of claim 7, wherein a center of a gate of the first transistor and a center of a gate of the second transistor has a first distance, and the center of the gate of the second transistor and a center of a gate of the third transistor has a second distance, wherein the second distance is less than two times the first distance.

9. The semiconductor structure of claim 7, wherein the diffusion break has a width and the gates of the first, second, third, and fourth transistors have a length, wherein the width of the diffusion break is smaller than the length of the gates.

10. The semiconductor structure of claim 7, wherein the first, second, third, and fourth transistors have their respective sidewall spacers, wherein two opposing sidewall spacers of the first transistor and the second transistor has a first gap and two opposing sidewall spacers of the second transistor and the third transistor has a second gap, wherein the second gap equals two times the first gap plus the width of the diffusion break.

11. The semiconductor structure of claim 10, wherein a third gap between two opposing sidewall spacers of the third transistor and the fourth transistor equals the first gap.

12. The semiconductor structure of claim 7, wherein the diffusion break is adjacent to a source/drain (S/D) epi region of the second transistor and adjacent to a S/D epi region of the third transistor.

13. The semiconductor structure of claim 12, wherein the diffusion break extends into a substrate underneath the second and third transistors to separate the S/D epi region of the second transistor from the S/D epi region of the third transistor.

14. The semiconductor structure of claim 7, wherein the diffusion break is a single diffusion break of dielectric material, and the first, second, third, and fourth transistors are nanosheet transistors.

* * * * *